United States Patent
Tsaur et al.

(10) Patent No.: US 9,685,780 B2
(45) Date of Patent: Jun. 20, 2017

(54) ESD PROTECTION CIRCUIT

(71) Applicant: Realtek Semiconductor Corp., HsinChu (TW)

(72) Inventors: Tay-Her Tsaur, Tai-Nan (TW); Cheng-Cheng Yen, Hsinchu (TW)

(73) Assignee: Realtek Semiconductor Corp., HsinChu (TW)

( * ) Notice: Subject to any disclaimer, the term of this patent is extended or adjusted under 35 U.S.C. 154(b) by 71 days.

(21) Appl. No.: 14/463,648

(22) Filed: Aug. 19, 2014

(65) Prior Publication Data

US 2015/0124361 A1 May 7, 2015

(30) Foreign Application Priority Data

Nov. 6, 2013 (TW) .............................. 102140305 A (51) Int. Cl.
*H02H 3/00* (2006.01)
*H02H 9/04* (2006.01)
*H01L 27/02* (2006.01)

(52) U.S. Cl.
CPC ............ *H02H 9/046* (2013.01); *H02H 9/041* (2013.01); *H01L 27/0251* (2013.01); *H01L 27/0285* (2013.01); *H02H 9/04* (2013.01)

(58) Field of Classification Search
USPC .................................................. 361/56, 111
See application file for complete search history.

(56) References Cited

U.S. PATENT DOCUMENTS

| | | | |
|---|---|---|---|
| 4,797,899 A | 1/1989 | Fuller | |
| 5,946,177 A | 8/1999 | Miller | |
| 6,385,021 B1 | 5/2002 | Takeda | |
| 6,455,902 B1 | 9/2002 | Voldman | |
| 6,724,603 B2 | 4/2004 | Miller | |
| 6,958,896 B2 | 10/2005 | Lin | |
| 6,989,979 B1 | 1/2006 | Tong | |
| 2009/0316316 A1* | 12/2009 | Shiota | H01L 27/0285 361/56 |
| 2010/0321841 A1* | 12/2010 | Worley | H02H 9/046 361/56 |
| 2011/0043953 A1* | 2/2011 | Ker | H02H 9/046 361/56 |

(Continued)

FOREIGN PATENT DOCUMENTS

| | | |
|---|---|---|
| CN | 102222892 A | 10/2011 |
| TW | 200924338 | 6/2009 |
| TW | 201320052 | 5/2013 |

*Primary Examiner* — Danny Nguyen
(74) *Attorney, Agent, or Firm* — Winston Hsu (57) ABSTRACT

The disclosure provides an ESD protection circuit. The ESD protection circuit comprises: a clamping unit, a driving unit, a resistance unit, a switch unit, and a capacitance unit. The clamping device is coupled between a first power source and a second power source. The driving unit is coupled between the clamping device and a reference node. The resistance unit is coupled between the first power source and the reference node. The switch unit is coupled to the driving unit via the reference node. The capacitance unit is coupled between the switch unit and the second power source. Under a normal operation condition, the driving unit controls the switch unit to be in an un-conducting status. Under an ESD condition, the driving unit controls the switch unit to be in a conducting status.

13 Claims, 6 Drawing Sheets

(56) References Cited

U.S. PATENT DOCUMENTS

2011/0149449 A1* 6/2011 Lin .................. H01L 27/0262
361/56
2013/0182359 A1* 7/2013 Jeon .................. H02H 9/046
361/56

* cited by examiner

ESD PROTECTION CIRCUIT

BACKGROUND OF THE INVENTION

1. Field of the Invention

The present invention relates to an ESD protection circuit, and more particularly, to an ESD protection circuit capable of eliminating gate leakage current.

2. Description of the Prior Art

Figure 1:
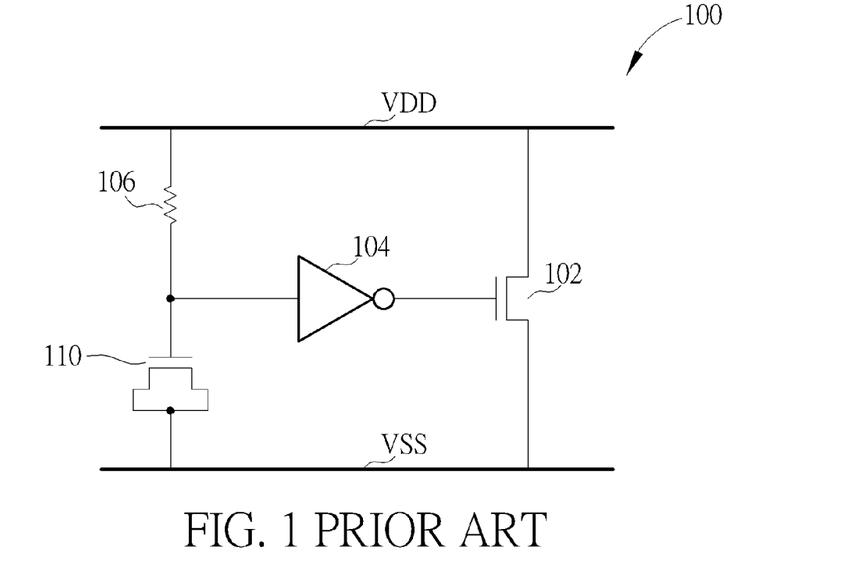
FIG. 1 shows a simplified block diagram of a conventional ESD protection circuit.

Please refer to FIG. 1. FIG. 1 shows a simplified block diagram of a conventional ESD protection circuit 100, wherein the ESD protection circuit 100 is an RC-based power-rail ESD clamp circuit. As shown in FIG. 1, the ESD protection circuit 100 comprises: a clamping unit 102, a driving unit 104, a resistance unit 106, and a capacitance unit 110. The clamping device 102 is an N-type metal-oxide-semiconductor (NMOS), and the driving unit 104 is an inverter. Under a normal operation condition, an input terminal of the inverter is at a high voltage level, and thus the output terminal of the inverter is at a low voltage level, and the clamping device 102 (i.e. the NMOS) is turned off. In addition, under an ESD condition, the input terminal of the inverter is initially at a low voltage level comparing with a first power source VDD due to RC time delay generated by the resistance unit 106, and the capacitance unit 110, and thus the output terminal of the inverter will generate a high voltage level to respectively turned on the clamping device 102 (i.e. the NMOS), so as to provide a low impedance path between the first power source VDD and a second power source VSS to eliminate the ESD current.

Figure 2:
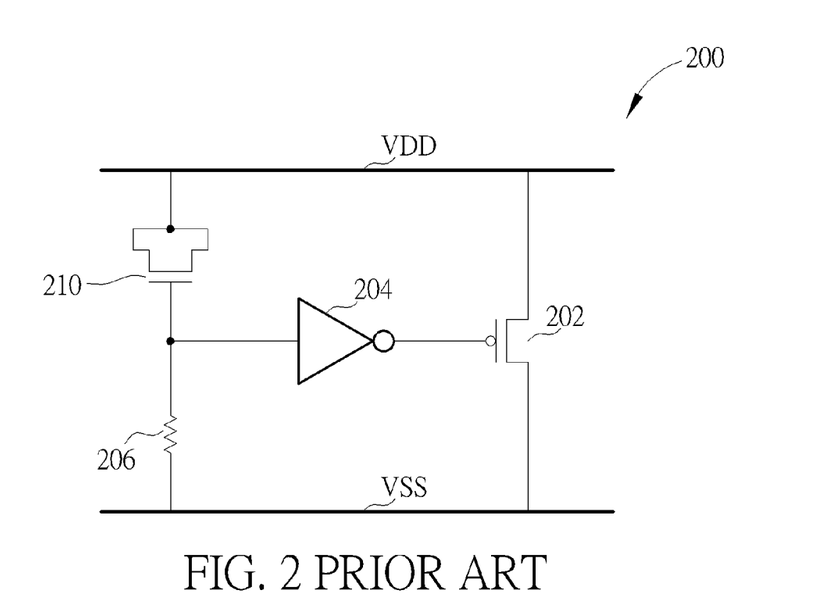
FIG. 2 shows a simplified block diagram of another conventional ESD protection circuit.

In addition, please refer to FIG. 2. FIG. 2 shows a simplified block diagram of another conventional ESD protection circuit 200, wherein the ESD protection circuit 200 is a CR-based power-rail ESD clamp circuit. As shown in FIG. 2, the ESD protection circuit 200 comprises: a clamping unit 202, a driving unit 204, a resistance unit 206, and a capacitance unit 210. The clamping device 202 is a P-type metal-oxide-semiconductor (PMOS), and the driving unit 204 is an inverter. Under a normal operation condition, an input terminal of the inverter is at a low voltage level, and thus the output terminal of the inverter is at a high voltage level, and the clamping device 202 (i.e. the PMOS) is turned off. In addition, under an ESD condition, the input terminal of the inverter is initially at a high voltage level comparing with a second power source VSS due to RC time delay generated by the resistance unit 206, and the capacitance unit 210, and thus the output terminal of the inverter will generate a low voltage level to respectively turned on the clamping device 202 (i.e. the PMOS), so as to provide a low impedance path between a first power source VDD and the second power source VSS to eliminate the ESD current.

However, in the advanced CMOS semiconductor process technology, although a metal-oxide-capacitance using a thinner gate oxide layer process requires smaller area, the thinner gate oxide layer will result in larger gate leakage current. Thus, when the capacitance units 110, 210 of the conventional ESD protection circuits 100, 200 are metal-oxide-capacitances with the thin gate oxide layer, the larger gate leakage current generated by the capacitance units 110, 210 may make the conventional ESD protection circuits 100, 200 or other circuits in a chip not able to operate normally.

SUMMARY OF THE INVENTION

It is therefore one of the objectives of the present invention to provide an ESD protection circuit capable of eliminating or minimizing gate leakage current of a capacitance unit and avoiding problems caused by the gate leakage current.

In accordance with an embodiment of the present invention, an ESD protection circuit is disclosed. The ESD protection circuit comprises: a clamping unit, a driving unit, a resistance unit, a switch unit, and a capacitance unit. The clamping device is coupled between a first power source and a second power source. The driving unit is coupled between the clamping device and a reference node. The resistance unit is coupled between the first power source and the reference node. The switch unit is coupled to the driving unit via the reference node. The capacitance unit is coupled between the switch unit and the second power source. Under a normal operation condition, the driving unit controls the switch unit to be in an un-conducting status. Under an ESD condition, the driving unit controls the switch unit to be in a conducting status.

In accordance with an embodiment of the present invention, an ESD protection circuit is disclosed. The ESD protection circuit comprises: a clamping unit, a driving unit, a resistance unit, a switch unit, and a capacitance unit. The clamping device is coupled between a first power source and a second power source. The driving unit is coupled between the clamping device and a reference node. The resistance unit is coupled between the first power source and the reference node. The switch unit is coupled to the driving unit. The capacitance unit is coupled between the switch unit and the second power source. The switch unit is coupled between the resistance unit and the capacitance unit, and under a normal operation condition, the driving unit controls the switch unit to be in an un-conducting status. Under an ESD condition, the driving unit controls the switch unit to be in a conducting status.

Briefly summarized, compared with prior art, the ESD protection circuit disclosed by the present invention can control the switch unit to be in an un-conducting status under a normal operation condition so as to make no current pass through the capacitance unit, and thus the present invention can avoid problems caused by the gate leakage current.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
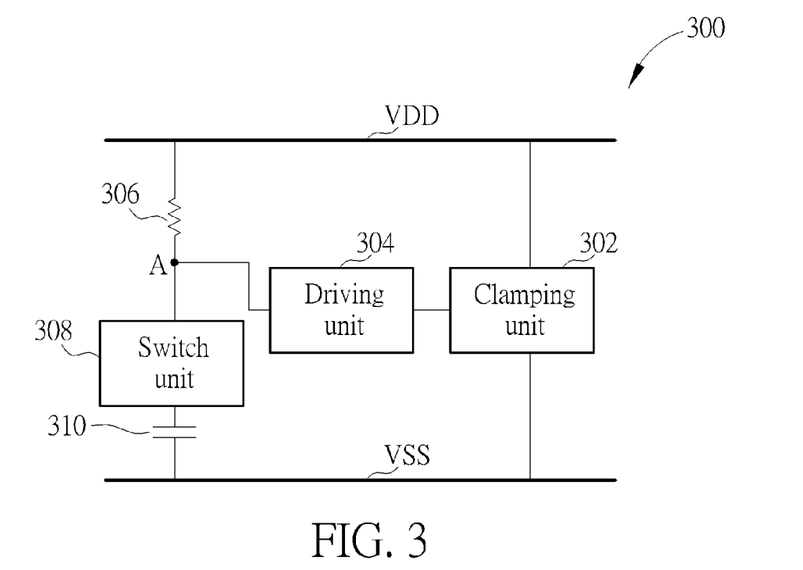
FIG. 3 shows a simplified block diagram of an ESD protection circuit in accordance with a first embodiment of the present invention.

Please refer to FIG. 3. FIG. 3 shows a simplified block diagram of an ESD protection circuit 300 in accordance with a first embodiment of the present invention, wherein the ESD protection circuit 300 is an RC-based power-rail ESD clamp circuit. As shown in FIG. 3, the ESD protection circuit 300 comprises: a clamping unit 302, a driving unit 304, a resistance unit 306, a switch unit 308, and a capacitance unit 310. The clamping device 302 is coupled between a first power source VDD and a second power source VSS, and the driving unit 304 is coupled between the clamping device 302 and a reference node A, wherein the driving unit 304 can comprise a plurality of inverting units. The resistance unit 306 is coupled between the first power source VDD and the reference node A, and the switch unit 308 is coupled to the driving unit 304 via the reference node A, wherein the switch unit 308 can be an N-type metal-oxide-semiconductor (NMOS), a P-type metal-oxide-semiconductor (PMOS), a transmission gate, or circuit designs with on/off control states. The capacitance unit 310 is coupled between the switch unit 308 and the second power source VSS, wherein the capacitance unit 310 can be a metal-oxide-capacitance with a thin gate oxide layer. The switch unit 308 is preferred to be coupled between the resistance unit 306 and the capacitance unit 310. Under a normal operation condition, the driving unit 304 will control the switch unit 308 to be in an un-conducting status so as to make no current pass through the capacitance unit 310, and thus the present invention can reduce or eliminate gate leakage current of the capacitance unit 310, and avoid problems caused by the gate leakage current. In addition, under an ESD condition, the driving unit 304 will control the switch unit 308 to be in a conducting status so as to make the ESD protection circuit 300 perform a normal ESD protection function.

Figure 4:
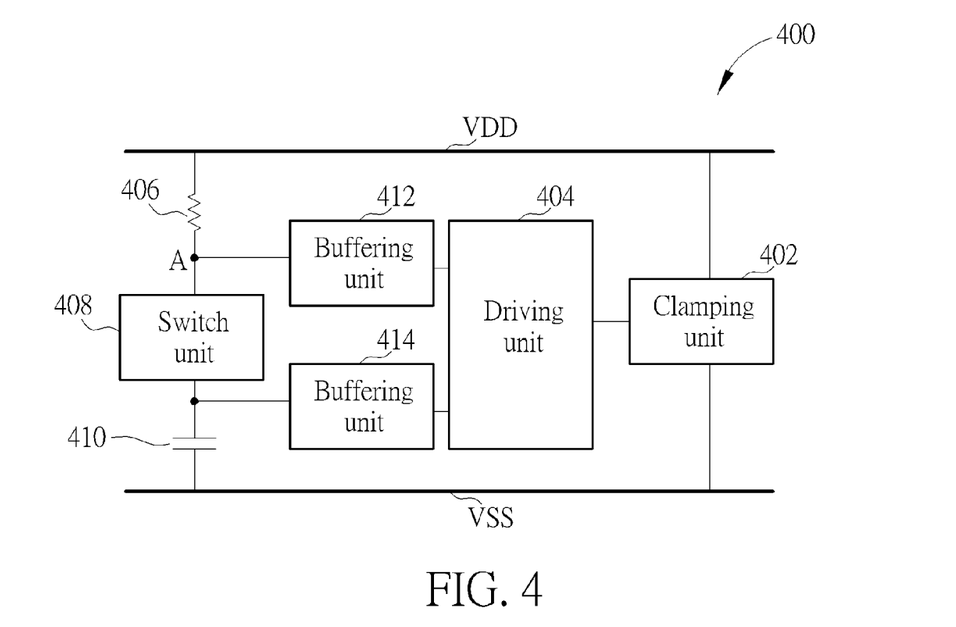
FIG. 4 shows a simplified block diagram of an ESD protection circuit in accordance with a second embodiment of the present invention.

In addition, please note that the above embodiment is only for an illustrative purpose and is not meant to be a limitation of the present invention. For example, please refer to FIG. 4. FIG. 4 shows a simplified block diagram of an ESD protection circuit 400 in accordance with a second embodiment of the present invention, wherein the ESD protection circuit 400 is an RC-based power-rail ESD clamp circuit. As shown in FIG. 4, the ESD protection circuit 400 comprises: a clamping unit 402, a driving unit 404, a resistance unit 406, a switch unit 408, a capacitance unit 410, and two buffering unit 412, 414.

Figure 5:
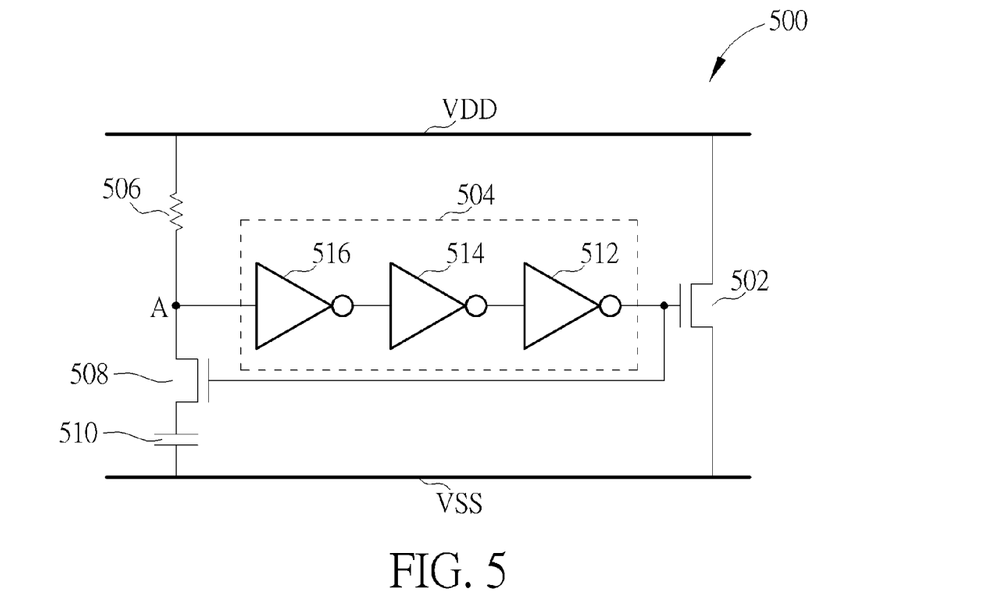
FIG. 5 shows a simplified block diagram of an ESD protection circuit in accordance with a third embodiment of the present invention.

Please refer to FIG. 5. FIG. 5 shows a simplified block diagram of an ESD protection circuit 500 in accordance with a third embodiment of the present invention, wherein the ESD protection circuit 500 is an RC-based power-rail ESD clamp circuit. As shown in FIG. 5, the ESD protection circuit 500 comprises: a clamping unit 502, a driving unit 504, a resistance unit 506, a switch unit 508, and a capacitance unit 510. The clamping device 502 is coupled between a first power source VDD and a second power source VSS, wherein the clamping unit 502 is an NMOS, and the driving unit 504 is coupled between the clamping device 502 and a reference node A, wherein the driving unit 504 comprises three inverting units 512, 514, 516. The resistance unit 506 is coupled between the first power source VDD and the reference node A, and the switch unit 508 is coupled to the driving unit 504 via the reference node A, wherein the switch unit 508 is an NMOS, and a gate of the NMOS is coupled to an output terminal of the inverting unit 512, a drain of the NMOS is coupled to the reference node A, and a source of the NMOS is coupled to the capacitance unit 510. The capacitance unit 510 is coupled between the switch unit 508 and the second power source VSS, wherein the capacitance unit 510 can be a metal-oxide-capacitance with a thin gate oxide layer. Under a normal operation condition, the reference node A (i.e. an input terminal of the inverting unit 516) is at a high voltage level, and thus the output terminal of the inverting unit 512 will generate a low voltage level, and the switch unit 508 (i.e. the NMOS) and the clamping device 502 (i.e. the NMOS) will be turned off, respectively. In other words, under the normal operation condition, the driving unit 504 will control the switch unit 508 to be in an un-conducting status so as to make no current pass through the capacitance unit 510, and thus the present invention can reduce or eliminate gate leakage current of the capacitance unit 510, and avoid problems caused by the gate leakage current. In addition, under an ESD condition, the reference node A (i.e. the input terminal of the inverting unit 516) is initially at a low voltage level comparing with the first power source VDD, and thus the output terminal of the inverting unit 512 will generate a high voltage level to respectively turned on the switch unit 508 (i.e. the NMOS) and the clamping device 502 (i.e. the NMOS), so as to provide a low impedance path between the first power source VDD and the second power source VSS to eliminate the ESD current. In other words, under the ESD condition, the driving unit 504 will control the switch unit 508 to be in a conducting status (i.e. the switch unit 508 will be in the conducting status due to the ESD) so as to make the ESD protection circuit 500 perform a normal ESD protection function. In addition, please note that the above embodiment is only for an illustrative purpose and is not meant to be a limitation of the present invention. For example, the number of the inverting units can be changed according to different circuit design requirements.

Figure 6:
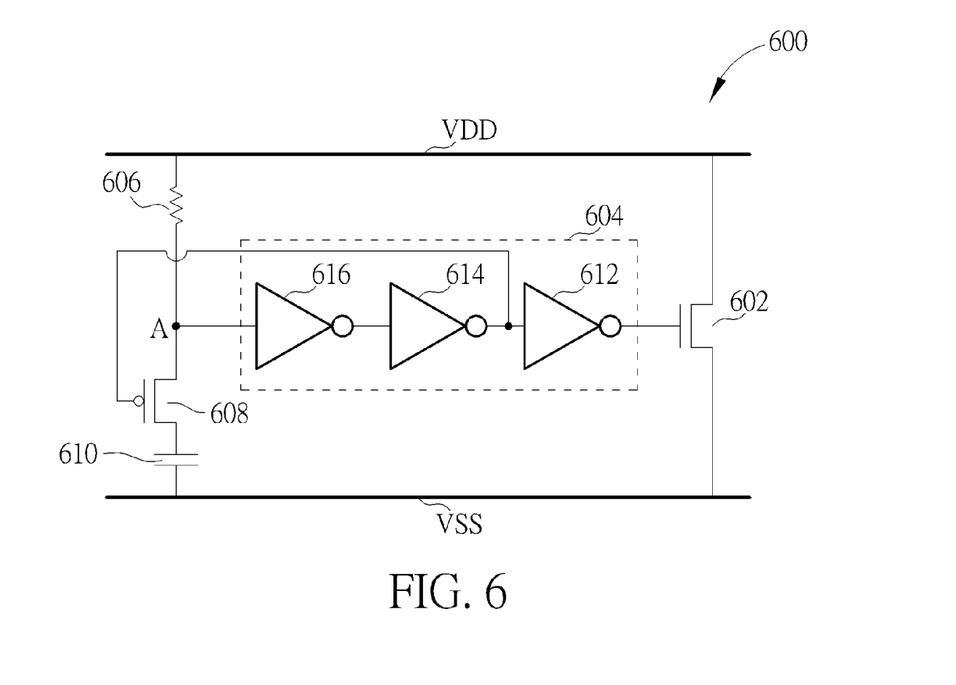
FIG. 6 shows a simplified block diagram of an ESD protection circuit in accordance with a fourth embodiment of the present invention.

Please refer to FIG. 6. FIG. 6 shows a simplified block diagram of an ESD protection circuit 600 in accordance with a fourth embodiment of the present invention, wherein the ESD protection circuit 600 is an RC-based power-rail ESD clamp circuit. As shown in FIG. 6, the ESD protection circuit 600 comprises: a clamping unit 602, a driving unit 604, a resistance unit 606, a switch unit 608, and a capacitance unit 610. The clamping device 602 is coupled between a first power source VDD and a second power source VSS, wherein the clamping unit 602 is an NMOS, and the driving unit 604 is coupled between the clamping device 602 and a reference node A, wherein the driving unit 604 comprises three inverting units 612, 614, 616. The resistance unit 606 is coupled between the first power source VDD and the reference node A, and the switch unit 608 is coupled to the driving unit 604 via the reference node A, wherein the switch unit 608 is an PMOS, and a gate of the PMOS is coupled to an output terminal of the inverting unit 614, a source of the PMOS is coupled to the reference node A, and a drain of the PMOS is coupled to the capacitance unit 610. The capacitance unit 610 is coupled between the switch unit 608 and the second power source VSS, wherein the capacitance unit 610 can be a metal-oxide-capacitance with a thin gate oxide layer. Under a normal operation condition, the reference node A (i.e. an input terminal of the inverting unit 616) is at a high voltage level, and thus the output terminal of the inverting unit 614 will generate a high voltage level and the output terminal of the inverting unit 612 will generate a low voltage level, and the switch unit 608 (i.e. the PMOS) and the clamping device 602 (i.e. the NMOS) will be turned off, respectively. In other words, under the normal operation condition, the driving unit 604 will control the switch unit 608 to be in an un-conducting status so as to make no current pass through the capacitance unit 610, and thus the present invention can reduce or eliminate gate leakage current of the capacitance unit 610, and avoid problems caused by the gate leakage current. In addition, under an ESD condition, the reference node A (i.e. the input terminal of the inverting unit 616) is initially at a low voltage level comparing with the first power source VDD, and thus the output terminal of the inverting unit 614 will generate a low voltage level and the output terminal of the inverting unit 612 will generate a high voltage level to respectively turned on the switch unit 608 (i.e. the PMOS) and the clamping device 602 (i.e. the NMOS), so as to provide a low impedance path between the first power source VDD and the second power source VSS to eliminate the ESD current. In other words, under the ESD condition, the driving unit 604 will control the switch unit 608 to be in a conducting status (i.e. the switch unit 608 will be in the conducting status due to the ESD) so as to make the ESD protection circuit 600 perform a normal ESD protection function. In addition, please note that the above embodiment is only for an illustrative purpose and is not meant to be a limitation of the present invention. For example, the number of the inverting units can be changed according to different circuit design requirements.

Figure 7:
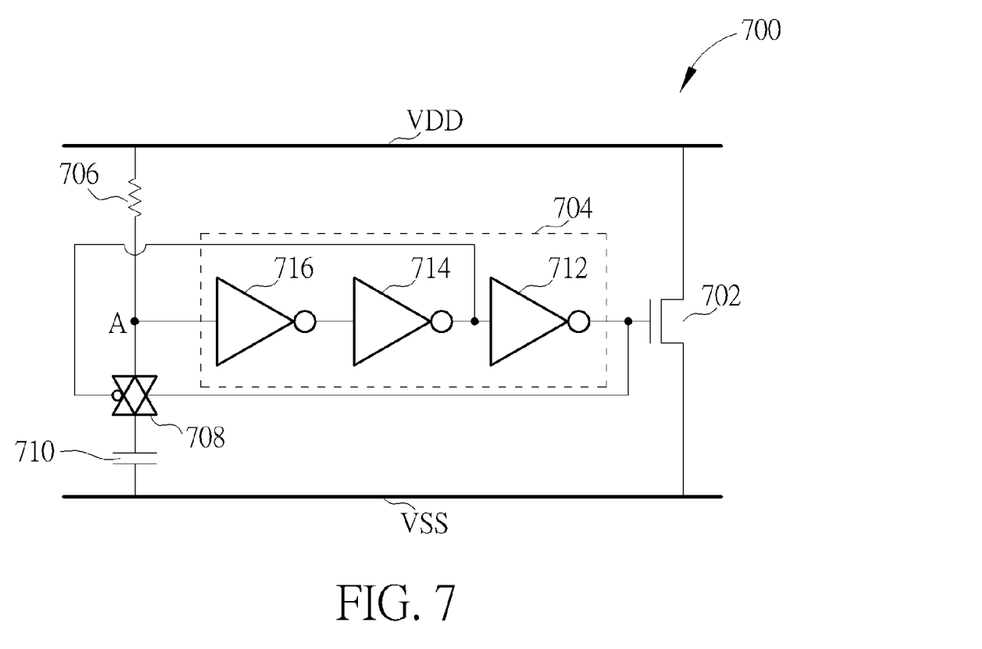
FIG. 7 shows a simplified block diagram of an ESD protection circuit in accordance with a fifth embodiment of the present invention.

Please refer to FIG. 7. FIG. 7 shows a simplified block diagram of an ESD protection circuit 700 in accordance with a fifth embodiment of the present invention, wherein the ESD protection circuit 700 is an RC-based power-rail ESD clamp circuit. As shown in FIG. 7, the ESD protection circuit 700 comprises: a clamping unit 702, a driving unit 704, a resistance unit 706, a switch unit 708, and a capacitance unit 710. The clamping device 702 is coupled between a first power source VDD and a second power source VSS, wherein the clamping unit 702 is an NMOS, and the driving unit 704 is coupled between the clamping device 702 and a reference node A, wherein the driving unit 704 comprises three inverting units 712, 714, 716. The resistance unit 706 is coupled between the first power source VDD and the reference node A, and the switch unit 708 is coupled to the driving unit 704 via the reference node A, wherein the switch unit 708 is a transmission gate. The capacitance unit 710 is coupled between the switch unit 708 and the second power source VSS, wherein the capacitance unit 710 can be a metal-oxide-capacitance with a thin gate oxide layer. Under a normal operation condition, the reference node A (i.e. an input terminal of the inverting unit 716) is at a high voltage level, and thus the output terminal of the inverting unit 714 will generate a high voltage level and the output terminal of the inverting unit 712 will generate a low voltage level, and the switch unit 708 (i.e. the transmission gate) and the clamping device 702 (i.e. the NMOS) will be turned off, respectively. In other words, under the normal operation condition, the driving unit 704 will control the switch unit 708 to be in an un-conducting status so as to make no current pass through the capacitance unit 710, and thus the present invention can reduce or eliminate gate leakage current of the capacitance unit 710, and avoid problems caused by the gate leakage current. In addition, under an ESD condition, the reference node A (i.e. the input terminal of the inverting unit 716) is initially at a low voltage level comparing with the first power source VDD, and thus the output terminal of the inverting unit 714 will generate a low voltage level and the output terminal of the inverting unit 712 will generate a high voltage level to respectively turned on the switch unit 708 (i.e. the transmission gate) and the clamping device 702 (i.e. the NMOS), so as to provide a low impedance path between the first power source VDD and the second power source VSS to eliminate the ESD current. In other words, under the ESD condition, the driving unit 704 will control the switch unit 708 to be in a conducting status (i.e. the switch unit 708 will be in the conducting status due to the ESD) so as to make the ESD protection circuit 700 perform a normal ESD protection function. In addition, please note that the above embodiment is only for an illustrative purpose and is not meant to be a limitation of the present invention. For example, the number of the inverting units can be changed according to different circuit design requirements.

Figure 8:
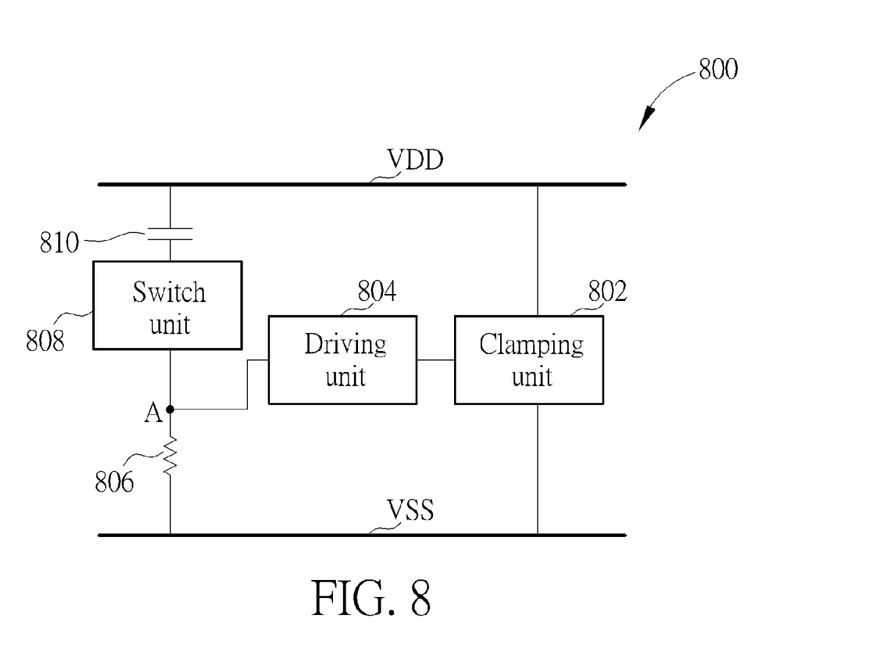
FIG. 8 shows a simplified block diagram of an ESD protection circuit in accordance with a sixth embodiment of the present invention.

Please refer to FIG. 8. FIG. 8 shows a simplified block diagram of an ESD protection circuit 800 in accordance with a sixth embodiment of the present invention, wherein the ESD protection circuit 800 is a CR-based power-rail ESD clamp circuit. As shown in FIG. 8, the ESD protection circuit 800 comprises: a clamping unit 802, a driving unit 804, a resistance unit 806, a switch unit 808, and a capacitance unit 810. The clamping device 802 is coupled between a first power source VSS and a second power source VDD, and the driving unit 804 is coupled between the clamping device 802 and a reference node A, wherein the driving unit 804 can comprise a plurality of inverting units. The resistance unit 806 is coupled between the first power source VSS and the reference node A, and the switch unit 808 is coupled to the driving unit 804 via the reference node A, wherein the switch unit 808 can be an N-type metal-oxide-semiconductor (NMOS), a P-type metal-oxide-semiconductor (PMOS), a transmission gate, or circuit designs with on/off control states. The capacitance unit 810 is coupled between the switch unit 808 and the second power source VSS, wherein the capacitance unit 810 can be a metal-oxide-capacitance with a thin gate oxide layer. The switch unit 808 is preferred to be coupled between the resistance unit 806 and the capacitance unit 810. Under a normal operation condition, the driving unit 804 will control the switch unit 808 to be in an un-conducting status so as to make no current pass through the capacitance unit 810, and thus the present invention can reduce or eliminate gate leakage current of the capacitance unit 810, and avoid problems caused by the gate leakage current. In addition, under an ESD condition, the driving unit 804 will control the switch unit 808 to be in a conducting status so as to make the ESD protection circuit 800 perform a normal ESD protection function.

Figure 9:
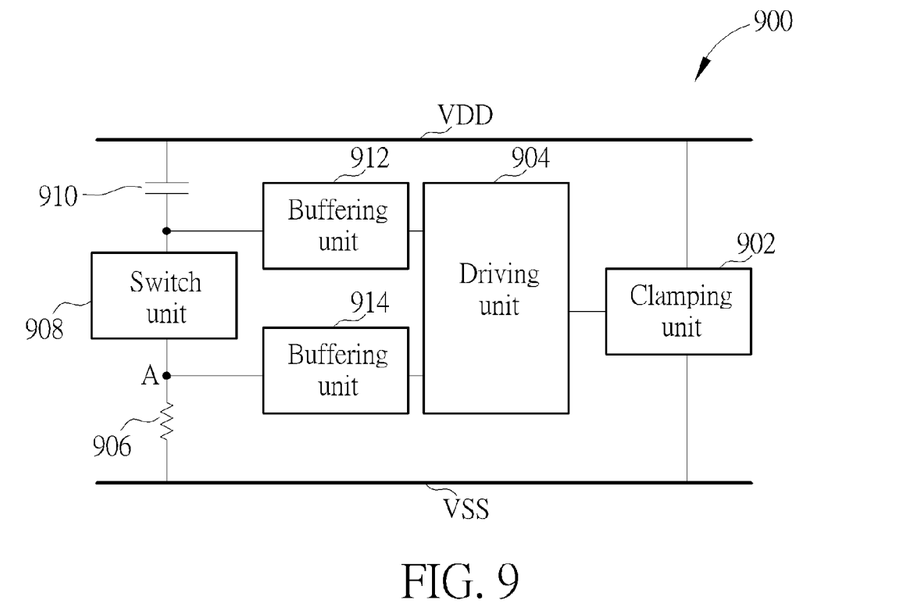
FIG. 9 shows a simplified block diagram of an ESD protection circuit in accordance with a seventh embodiment of the present invention.

In addition, please note that the above embodiment is only for an illustrative purpose and is not meant to be a limitation of the present invention. For example, please refer to FIG. 9. FIG. 9 shows a simplified block diagram of an ESD protection circuit 900 in accordance with a seventh embodiment of the present invention, wherein the ESD protection circuit 900 is an RC-based power-rail ESD clamp circuit. As shown in FIG. 9, the ESD protection circuit 900 comprises:

a clamping unit 902, a driving unit 904, a resistance unit 906, a switch unit 908, a capacitance unit 910, and two buffering unit 912, 914.

Figure 10:
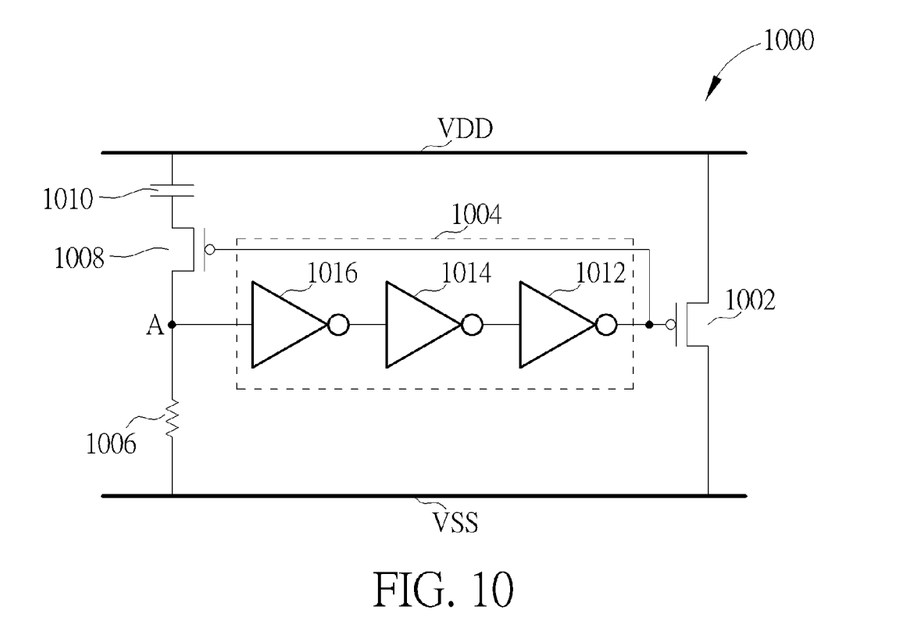
FIG. 10 shows a simplified block diagram of an ESD protection circuit in accordance with an eighth embodiment of the present invention.

Please refer to FIG. 10. FIG. 10 shows a simplified block diagram of an ESD protection circuit 1000 in accordance with an eighth embodiment of the present invention, wherein the ESD protection circuit 1000 is a CR-based power-rail ESD clamp circuit. As shown in FIG. 10, the ESD protection circuit 1000 comprises: a clamping unit 1002, a driving unit 1004, a resistance unit 1006, a switch unit 1008, and a capacitance unit 1010. The clamping device 1002 is coupled between a first power source VSS and a second power source VDD, wherein the clamping unit 1002 is an PMOS, and the driving unit 1004 is coupled between the clamping device 1002 and a reference node A, wherein the driving unit 1004 comprises three inverting units 1012, 1014, 1016. The resistance unit 1006 is coupled between the first power source VSS and the reference node A, and the switch unit 1008 is coupled to the driving unit 1004 via the reference node A, wherein the switch unit 1008 is an PMOS, and a gate of the PMOS is coupled to an output terminal of the inverting unit 1012, a drain of the PMOS is coupled to the reference node A, and a source of the PMOS is coupled to the capacitance unit 1010. The capacitance unit 1010 is coupled between the switch unit 1008 and the second power source VDD, wherein the capacitance unit 1010 can be a metal-oxide-capacitance with a thin gate oxide layer. Under a normal operation condition, the reference node A (i.e. an input terminal of the inverting unit 1016) is at a low voltage level, and thus the output terminal of the inverting unit 1012 will generate a high voltage level, and the switch unit 1008 (i.e. the PMOS) and the clamping device 1002 (i.e. the PMOS) will be turned off, respectively. In other words, under the normal operation condition, the driving unit 1004 will control the switch unit 1008 to be in an un-conducting status so as to make no current pass through the capacitance unit 1010, and thus the present invention can reduce or eliminate gate leakage current of the capacitance unit 1010, and avoid problems caused by the gate leakage current. In addition, under an ESD condition, the reference node A (i.e. the input terminal of the inverting unit 1016) is initially at a high voltage level comparing with the first power source VSS, and thus the output terminal of the inverting unit 1012 will generate a low voltage level to respectively turned on the switch unit 1008 (i.e. the PMOS) and the clamping device 1002 (i.e. the PMOS), so as to provide a low impedance path between the first power source VSS and the second power source VDD to eliminate the ESD current. In other words, under the ESD condition, the driving unit 1004 will control the switch unit 1008 to be in a conducting status (i.e. the switch unit 1008 will be in the conducting status due to the ESD) so as to make the ESD protection circuit 1000 perform a normal ESD protection function. In addition, please note that the above embodiment is only for an illustrative purpose and is not meant to be a limitation of the present invention. For example, the number of the inverting units can be changed according to different circuit design requirements.

Figure 11:
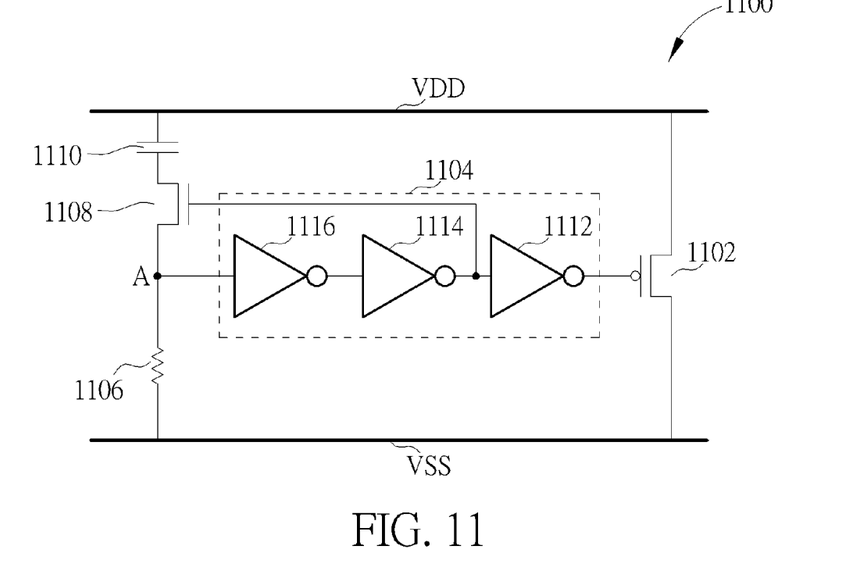
FIG. 11 shows a simplified block diagram of an ESD protection circuit in accordance with a ninth embodiment of the present invention.

Please refer to FIG. 11. FIG. 11 shows a simplified block diagram of an ESD protection circuit 1100 in accordance with a ninth embodiment of the present invention, wherein the ESD protection circuit 1100 is a CR-based power-rail ESD clamp circuit. As shown in FIG. 11, the ESD protection circuit 1100 comprises: a clamping unit 1102, a driving unit 1104, a resistance unit 1106, a switch unit 1108, and a capacitance unit 1110. The clamping device 1102 is coupled between a first power source VSS and a second power source VDD, wherein the clamping unit 1102 is an PMOS, and the driving unit 1104 is coupled between the clamping device 1102 and a reference node A, wherein the driving unit 1104 comprises three inverting units 1112, 1114, 1116. The resistance unit 1106 is coupled between the first power source VSS and the reference node A, and the switch unit 1108 is coupled to the driving unit 1104 via the reference node A, wherein the switch unit 1108 is an NMOS, and a gate of the NMOS is coupled to an output terminal of the inverting unit 1114, a source of the NMOS is coupled to the reference node A, and a drain of the NMOS is coupled to the capacitance unit 1110. The capacitance unit 1110 is coupled between the switch unit 1108 and the second power source VDD, wherein the capacitance unit 1110 can be a metal-oxide-capacitance with a thin gate oxide layer. Under a normal operation condition, the reference node A (i.e. an input terminal of the inverting unit 1116) is at a low voltage level, and thus the output terminal of the inverting unit 1114 will generate a low voltage level and the output terminal of the inverting unit 1112 will generate a high voltage level, and the switch unit 1108 (i.e. the PMOS) and the clamping device 1102 (i.e. the PMOS) will be turned off, respectively. In other words, under the normal operation condition, the driving unit 1104 will control the switch unit 1108 to be in an un-conducting status so as to make no current pass through the capacitance unit 1110, and thus the present invention can reduce or eliminate gate leakage current of the capacitance unit 1110, and avoid problems caused by the gate leakage current. In addition, under an ESD condition, the reference node A (i.e. the input terminal of the inverting unit 1116) is initially at a high voltage level comparing with the first power source VSS, and thus the output terminal of the inverting unit 1114 will generate a high voltage level and the output terminal of the inverting unit 1112 will generate a low voltage level to respectively turned on the switch unit 1108 (i.e. the NMOS) and the clamping device 1102 (i.e. the PMOS), so as to provide a low impedance path between the first power source VSS and the second power source VDD to eliminate the ESD current. In other words, under the ESD condition, the driving unit 1104 will control the switch unit 1108 to be in a conducting status (i.e. the switch unit 1108 will be in the conducting status due to the ESD) so as to make the ESD protection circuit 1100 perform a normal ESD protection function. In addition, please note that the above embodiment is only for an illustrative purpose and is not meant to be a limitation of the present invention. For example, the number of the inverting units can be changed according to different circuit design requirements.

Figure 12:
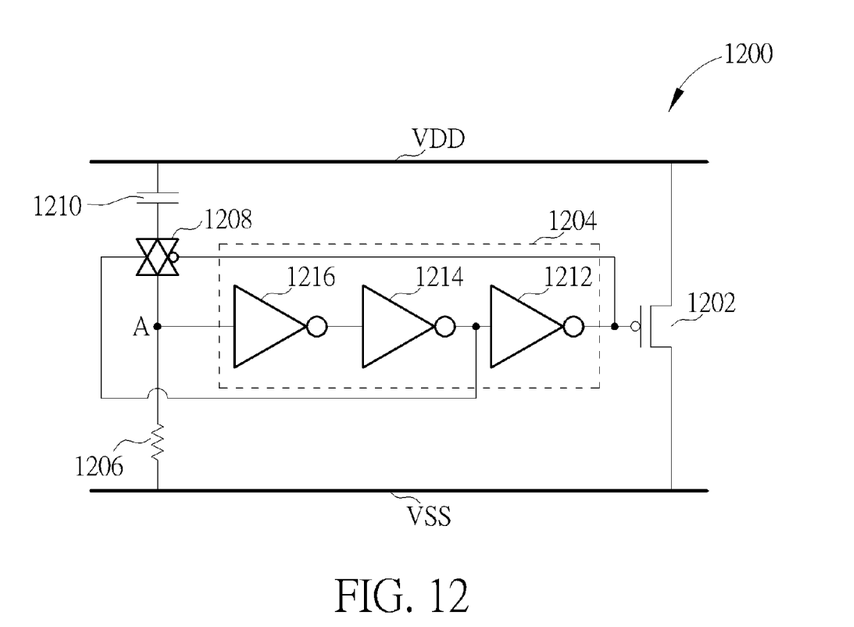
FIG. 12 shows a simplified block diagram of an ESD protection circuit in accordance with an tenth embodiment of the present invention.

Please refer to FIG. 12. FIG. 12 shows a simplified block diagram of an ESD protection circuit 1200 in accordance with a tenth embodiment of the present invention, wherein the ESD protection circuit 1200 is a CR-based power-rail ESD clamp circuit. As shown in FIG. 12, the ESD protection circuit 1200 comprises: a clamping unit 1202, a driving unit 1204, a resistance unit 1206, a switch unit 1208, and a capacitance unit 1210. The clamping device 1202 is coupled between a first power source VSS and a second power source VDD, wherein the clamping unit 1202 is an PMOS, and the driving unit 1204 is coupled between the clamping device 1202 and a reference node A, wherein the driving unit 1204 comprises three inverting units 1212, 1214, 1216. The resistance unit 1206 is coupled between the first power source VSS and the reference node A, and the switch unit 1208 is coupled to the driving unit 1204 via the reference node A, wherein the switch unit 1208 is an transmission gate. The capacitance unit 1210 is coupled between the switch unit 1208 and the second power source VDD, wherein the capacitance unit 1210 can be a metal-oxide-capacitance with a thin gate oxide layer. Under a normal operation condition, the reference node A (i.e. an input terminal of the inverting unit 1216) is at a low voltage level, and thus the output terminal of the inverting unit 1214 will generate a low voltage level and the output terminal of the inverting unit 1212 will generate a high voltage level, and the switch unit 1208 (i.e. the PMOS) and the clamping device 1202 (i.e. the PMOS) will be turned off, respectively. In other words, under the normal operation condition, the driving unit 1204 will control the switch unit 1208 to be in an un-conducting status so as to make no current pass through the capacitance unit 1210, and thus the present invention can reduce or eliminate gate leakage current of the capacitance unit 1210, and avoid problems caused by the gate leakage current. In addition, under an ESD condition, the reference node A (i.e. the input terminal of the inverting unit 1216) is initially at a high voltage level comparing with the first power source VSS, and thus the output terminal of the inverting unit 1214 will generate a high voltage level and the output terminal of the inverting unit 1212 will generate a low voltage level to respectively turned on the switch unit 1208 (i.e. the transmission gate) and the clamping device 1202 (i.e. the PMOS), so as to provide a low impedance path between the first power source VSS and the second power source VDD to eliminate the ESD current. In other words, under the ESD condition, the driving unit 1204 will control the switch unit 1208 to be in a conducting status (i.e. the switch unit 1208 will be in the conducting status due to the ESD) so as to make the ESD protection circuit 1200 perform a normal ESD protection function. In addition, please note that the above embodiment is only for an illustrative purpose and is not meant to be a limitation of the present invention. For example, the number of the inverting units can be changed according to different circuit design requirements.

Briefly summarized, compared with prior art, the ESD protection circuit disclosed by the present invention can control the switch unit to be in an un-conducting status under a normal operation condition so as to make no current pass through the capacitance unit, and thus the present invention can avoid problems caused by the gate leakage current.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An ESD protection circuit, comprising:
a clamping unit, coupled between a first power source and a second power source;
a driving unit, coupled between the clamping device and a reference node;
a resistance unit, coupled between the first power source and the reference node;
a switch unit, coupled to the driving unit; and
a capacitance unit, coupled between the switch unit and the second power source;
wherein the switch unit is coupled between the resistance unit and the capacitance unit, and under a normal operation condition, the driving unit controls the switch unit to be in an un-conducting status, and under an ESD condition, the driving unit controls the switch unit to be in a conducting status; the switch unit is a transmission gate; and the switch unit is coupled between the reference node and the capacitance unit.

2. The ESD protection circuit of claim 1, further comprising:
at least a buffering unit, coupled between the switch unit and the driving unit.

3. The ESD protection circuit of claim 1, wherein the driving unit comprises:
a plurality of inverting units, coupled between the switch unit and the clamping unit.

4. The ESD protection circuit of claim 1, wherein a voltage of the first power source is higher than a voltage of the second power source, and the ESD protection circuit is a RC-based power-rail ESD clamp circuit.

5. The ESD protection circuit of claim 1, wherein a voltage of the second power source is higher than a voltage of the first power source, and the ESD protection circuit is a CR-based power-rail ESD clamp circuit.

6. An ESD protection circuit, comprising:
a clamping unit, coupled between a first power source and a second power source;
a driving unit, coupled between the clamping device and a reference node;
a resistance unit, coupled between the first power source and the reference node;
a switch unit, coupled to the driving unit via the reference node; and
a capacitance unit, coupled between the switch unit and the second power source;
wherein under a normal operation condition, the driving unit controls the switch unit to be in an un-conducting status, and under an ESD condition, the driving unit controls the switch unit to be in a conducting status; and the switch unit is a transmission gate.

7. The ESD protection circuit of claim 6, further comprising:
at least a buffering unit, coupled between the switch unit and the driving unit.

8. The ESD protection circuit of claim 6, wherein the driving unit comprises:
a plurality of inverting units, coupled between the switch unit and the clamping unit.

9. The ESD protection circuit of claim 6, wherein the capacitance unit is a metal-oxide-capacitance with a thin gate oxide layer.

10. The ESD protection circuit of claim 6, wherein a voltage of the first power source is higher than a voltage of the second power source, and the ESD protection circuit is a RC-based power-rail ESD clamp circuit.

11. The ESD protection circuit of claim 10, wherein the clamping unit is an NMOS.

12. The ESD protection circuit of claim 6, wherein a voltage of the second power source is higher than a voltage of the first power source, and the ESD protection circuit is a CR-based power-rail ESD clamp circuit.

13. The ESD protection circuit of claim 12, wherein the clamping unit is a PMOS.

* * * * *